(12) United States Patent
Kim et al.

(10) Patent No.: US 11,269,208 B2
(45) Date of Patent: Mar. 8, 2022

(54) DISPLAY DEVICE COMPRISING A FIRST AUXILIARY SUBSTRATE INCLUDING A FIRST SECTION AND A SECOND SECTION ORIENTED AT A FIRST RIGHT-OR-ACUTE ANGLE RELATIVE TO THE FIRST SECTION AND TILED DISPLAY APPARATUS INCLUDING THE SAME

(71) Applicant: Samsung Display Co., Ltd., Yongin-Si (KR)

(72) Inventors: Duk Sung Kim, Yongin-si (KR); Jung Hyun Kwon, Yongin-si (KR)

(73) Assignee: Samsung Display Co., Ltd.

( * ) Notice: Subject to any disclaimer, the term of this patent is extended or adjusted under 35 U.S.C. 154(b) by 143 days.

(21) Appl. No.: 16/848,768

(22) Filed: Apr. 14, 2020

(65) Prior Publication Data

US 2021/0072579 A1 Mar. 11, 2021

(30) Foreign Application Priority Data

Sep. 11, 2019 (KR) .......................... 10-2019-0112671

(51) Int. Cl.
| | |
|---|---|
| *G02F 1/1333* | (2006.01) |
| *G06F 3/14* | (2006.01) |
| *G02F 1/133* | (2006.01) |
| *G02F 1/1339* | (2006.01) |
| *G02F 1/1335* | (2006.01) |

(Continued)

(52) U.S. Cl.
CPC ........ *G02F 1/13336* (2013.01); *G02F 1/1339* (2013.01); *G02F 1/13306* (2013.01); *G02F 1/133512* (2013.01); *G02F 1/134309* (2013.01); *G06F 3/1446* (2013.01); *H01L 27/3244* (2013.01); *G02F 1/133388* (2021.01)

(58) Field of Classification Search
CPC .......... G02F 1/13336; G02F 1/133388; H01L 27/3237

See application file for complete search history.

(56) References Cited

U.S. PATENT DOCUMENTS 5,867,236 A * 2/1999 Babuka ................. G02F 1/1339
349/73
10,416,950 B2 9/2019 Kim et al.
(Continued)

FOREIGN PATENT DOCUMENTS

| KR | 10-2015-0116218 A | 10/2015 |
|---|---|---|
| KR | 10-1895217 B1 | 9/2018 |

*Primary Examiner* — Paul C Lee
(74) *Attorney, Agent, or Firm* — Innovation Counsel LLP

(57) ABSTRACT

A display device includes a first substrate, a second substrate, a first auxiliary substrate, a second auxiliary substrate, and a display layer. The second substrate includes a display area and a non-display area. The display area overlaps the first substrate. The non-display area extends beyond the first substrate. The first auxiliary substrate includes a first section and a second section. The first section is between the first substrate and the display area. The second section overlaps the non-display area and is bent relative to the first section. The second auxiliary substrate includes a first part and a second part. The first part is between the first section and the display area. The second part overlaps the non-display area and is bent relative to the first part. The display layer is between the first section and the first part and includes pixels that overlap the display area.

17 Claims, 12 Drawing Sheets

(51) Int. Cl.
  *H01L 27/32* (2006.01)
  *G02F 1/1343* (2006.01)

(56) References Cited

U.S. PATENT DOCUMENTS

| | | | | |
|---|---|---|---|---|
| 2015/0022754 A1* | 1/2015 | Jepsen | ............... | G02F 1/13336 349/61 |
| 2015/0286457 A1* | 10/2015 | Kim | ............... | G02B 3/0037 345/581 |
| 2016/0238785 A1* | 8/2016 | Park | ............... | G02B 6/0076 |
| 2017/0086308 A1* | 3/2017 | Large | ............... | H05K 5/0226 |
| 2017/0090260 A1* | 3/2017 | Yu | ............... | G02F 1/13336 |
| 2017/0148374 A1* | 5/2017 | Lee | ............... | G09G 3/3648 |
| 2017/0178586 A1* | 6/2017 | Kim | ............... | G09G 3/3659 |
| 2018/0052312 A1* | 2/2018 | Jia | ............... | G02F 1/13336 |

* cited by examiner

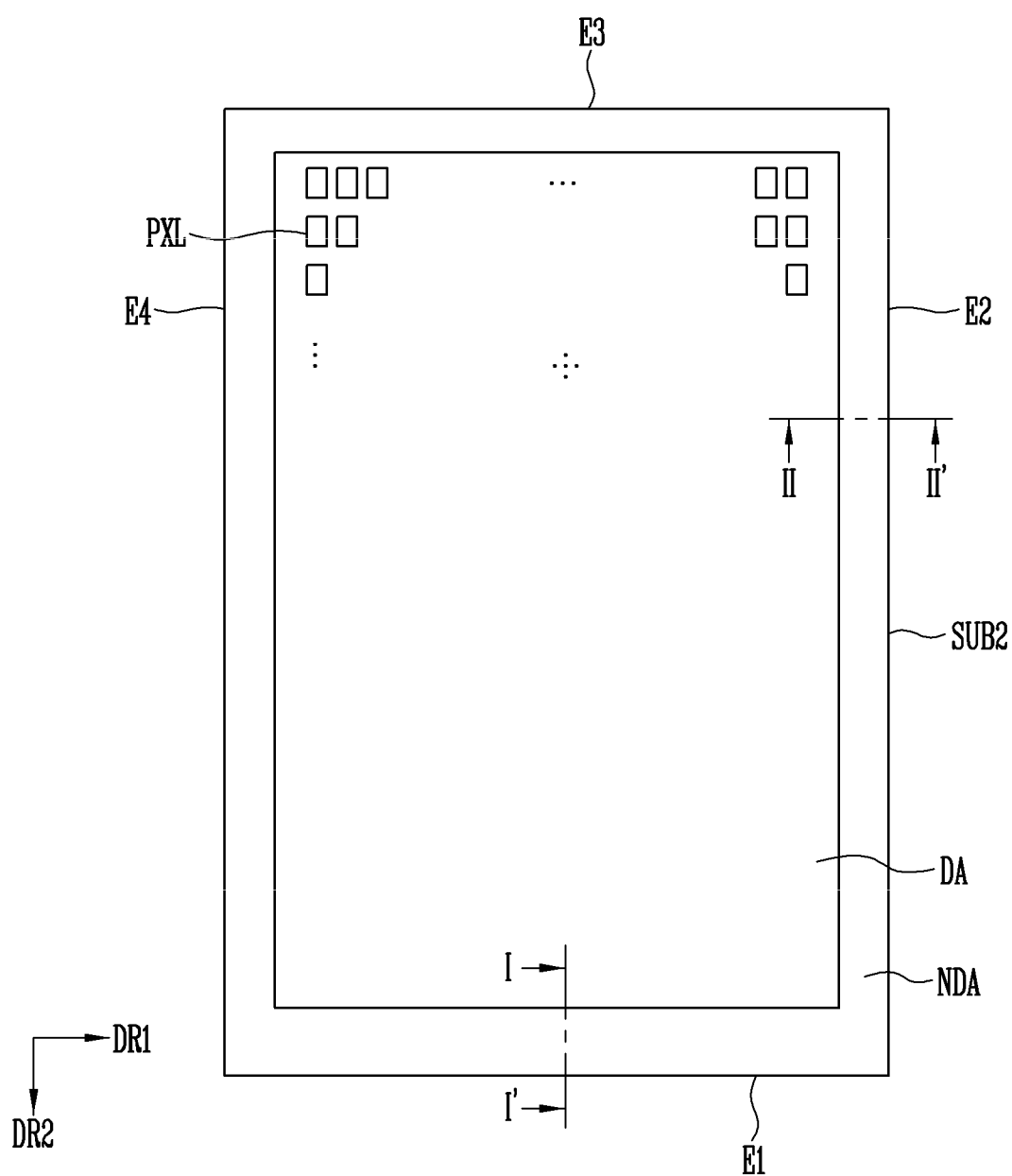

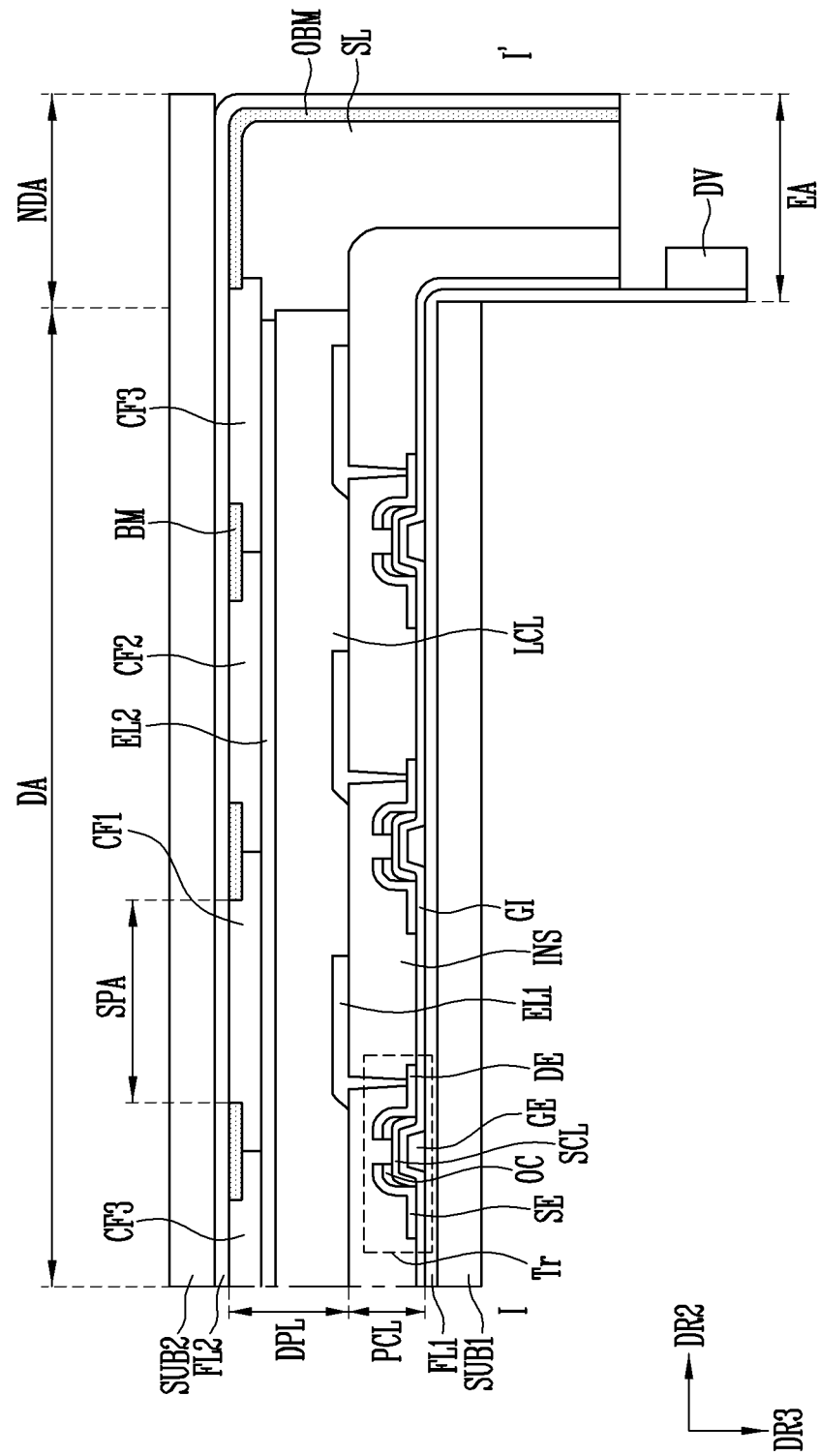

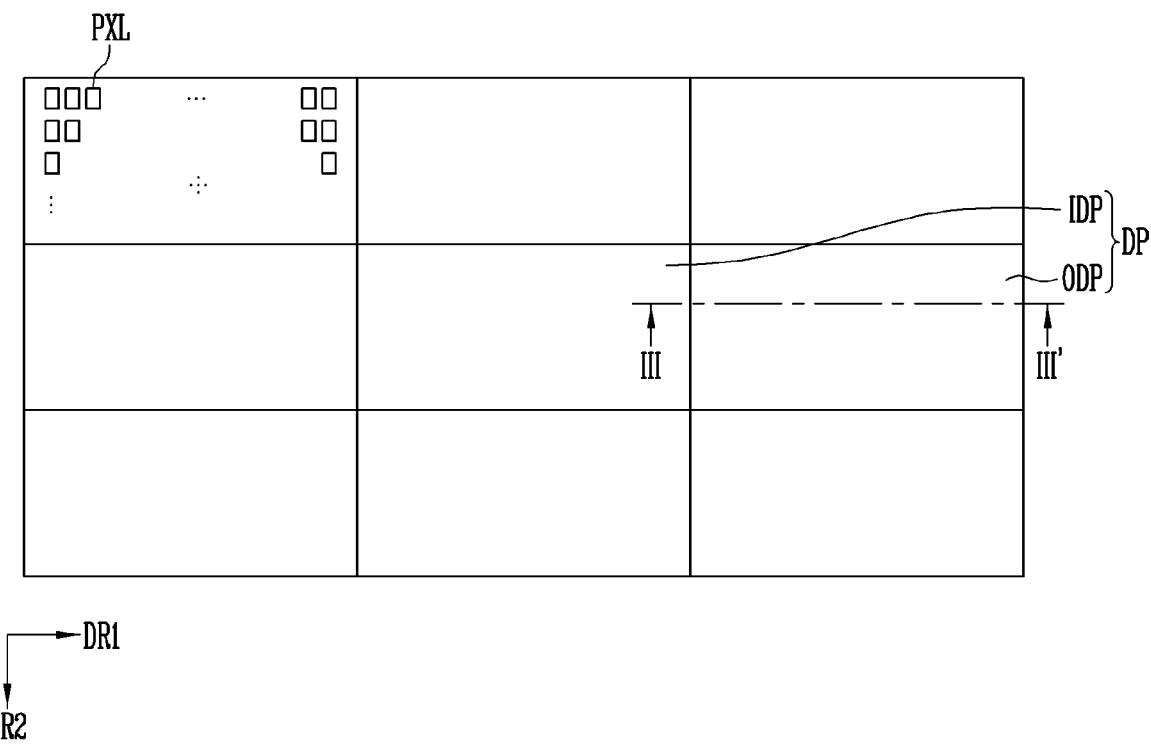

DISPLAY DEVICE COMPRISING A FIRST AUXILIARY SUBSTRATE INCLUDING A FIRST SECTION AND A SECOND SECTION ORIENTED AT A FIRST RIGHT-OR-ACUTE ANGLE RELATIVE TO THE FIRST SECTION AND TILED DISPLAY APPARATUS INCLUDING THE SAME

CROSS-REFERENCE TO RELATED APPLICATION

This application claims priority to and the benefit of Korean Patent Application No. 10-2019-0112671 filed in the Korean Intellectual Property Office on Sep. 11, 2019; the entire contents of the Korean Patent Application are incorporated herein by reference.

BACKGROUND

1. Field

The technical field relates to a display device and a tiled display apparatus including the display device.

2. Description of the Related Art

Modern display devices include liquid crystal display devices, organic light-emitting display devices, plasma display devices, and electrophoretic displays. A display device generally includes a display panel. The display panel may include a display area and a non-display area. The display area may display images. The non-display area may abut the display area and may not display images. Since the non-display area does not display images, it may be desirable to minimize the non-display area.

SUMMARY

Embodiments may be related to a display device having a reduced non-display area. Embodiments may be related to a tiled display apparatus.

A display device according to one embodiment includes a first substrate including a display area; a first auxiliary substrate provided on the first substrate; a display element layer provided on the first auxiliary substrate and including a plurality of pixels provided in the display area; a second auxiliary substrate provided on the display element layer; and a second substrate provided on the second auxiliary substrate and including a non-display area disposed in at least one side of the display area. The first auxiliary substrate and the second auxiliary substrate may overlap at least a portion of the non-display area of the second substrate and may be bent in a direction from the second substrate to the first substrate.

In one embodiment, the non-display area of the second substrate may include an edge area not overlapping the first substrate, and the first auxiliary substrate and the second auxiliary substrate may overlap the edge area and may be bent.

In one embodiment, each of the pixels may include a plurality of subpixel areas configured to output light beams having different colors, and a width of the edge area may be greater than a width of the subpixel areas in a direction toward the edge area from an area in which the second substrate and the first substrate overlap each other.

In one embodiment, the second substrate may further protrude as compared the first substrate in a direction toward the edge area from an area in which the second substrate and the first substrate overlap each other.

In one embodiment, the display device may further include a driver provided on the first auxiliary substrate and configured to supply a signal for driving the pixels.

In one embodiment, each of the pixels may include a first electrode provided on the first auxiliary substrate; a second electrode opposite to the first electrode; and a liquid crystal layer disposed between the first electrode and the second electrode.

In one embodiment, the display element layer may include a sealant configured to surround the liquid crystal layer, and the sealant may overlap the edge area.

In one embodiment, each of the pixels may include a first electrode provided on the first auxiliary substrate; a second electrode opposite to the first electrode; and an organic light-emitting layer disposed between the first electrode and the second electrode.

In one embodiment, the display element layer may further include an outer black matrix provided in the non-display area, and the edge area may overlap the outer black matrix.

The outer black matrix may include a first portion extending in a direction parallel to a surface of the second substrate, on which the second auxiliary substrate is provided; and a second portion extending in a direction from the second substrate to the first substrate.

In one embodiment, a thickness of the first auxiliary substrate may be smaller than a thickness of the second auxiliary substrate.

A tiled display apparatus according to another embodiment include an array of a plurality of display panels, wherein each of the display panels includes a first substrate including a display area; a first auxiliary substrate provided on the first substrate; a display element layer provided on the first auxiliary substrate and including a plurality of pixels provided on the display area; a second auxiliary substrate provided on the display element layer; and a second substrate provided on the second auxiliary substrate and including a non-display area surrounding at least one side of the display area. Each of the non-display areas of the second substrates adjacent to each other between the display panels may include an edge area not overlapping the first substrate. The first auxiliary substrate and the second auxiliary substrate may be overlap one side surface of the first substrate in the edge area and may be bent.

In one embodiment, each of the pixels of the display panels may include a plurality of subpixel areas configured to output light beams having different colors, and a width of the edge area may be smaller than a width of the subpixel areas in a direction toward the edge area from an area in which the second substrate and the first substrate overlap each other.

In one embodiment, the second substrate may further protrude as compared with the first substrate in a direction toward the edge area from an area in which the second substrate and the first substrate overlap each other.

In one embodiment, the tiled display apparatus may further include a driver provided on the first auxiliary substrate and configured to supply a signal for driving the pixels.

In one embodiment, the second substrate of each of the display panels disposed at an outer side of the array of the display panels may further include an outer edge area which is exposed to the outside and does not overlap the first substrate, and the first auxiliary substrate and the second auxiliary substrate may overlap the outer edge area and may be bent in a direction from the second substrate toward the first substrate.

In one embodiment, a thickness of the first auxiliary substrate may be smaller than a thickness of the second auxiliary substrate.

An embodiment may be related to a display device. The display device may include a first substrate, a second substrate, a first auxiliary substrate, a second auxiliary substrate, and a display element layer. The second substrate may include a display area and a non-display area. The display area may overlap a first face of the first substrate. The non-display area may extend beyond the first substrate in a direction parallel to the first face of the first substrate. The first auxiliary substrate may include a first section and a second section. The first section may overlap the display area and may be positioned between the first substrate and the display area. The second section may overlap the non-display area and may be oriented at a first right-or-acute angle relative to the first section. The second auxiliary substrate may include a first part and a second part. The first part may overlap the display area and may be positioned between the first section and the display area. The second part may overlap the non-display area and may be oriented at a second right-or-acute angle relative to the first part. The display element layer may be positioned between the first section and the first part and may include pixels for displaying an image. The pixels may overlap the display area.

The first right-or-acute angle may be a right angle (of 90 degrees).

The second right-or-acute angle may be a right angle (of 90 degrees).

The second section may be oriented at the first right-or-acute angle relative to the non-display area.

The display device may include at least one of a pixel defining layer and a black layer. A distance between two spaced and immediately neighboring portions of the pixel defining layer or of the black layer may be greater than a width of the non-display area. The width of the non-display area may extend in the direction parallel to the first face of the first substrate from an edge of the first substrate to an edge of the second substrate.

The first part of the second auxiliary substrate may overlap the first face of the first substrate. The second part of the second auxiliary substrate may overlap a second face of the first substrate and may not be oriented parallel to the first face of the first substrate.

The display device may include a driver positioned on the second section of the first auxiliary substrate and configured to supply a signal for controlling the pixels.

The pixels may include a first pixel. The first pixel may include the following elements: a first electrode positioned on the first section of the first auxiliary substrate; a second electrode positioned between the first electrode and the first part of the second auxiliary substrate; and a liquid crystal layer disposed between the first electrode and the second electrode.

The display device may include a sealant surrounding the liquid crystal layer and overlapping the non-display area. A face of the sealant may overlap a second face of the first substrate and may not be parallel to the first face of the first substrate.

The pixels may include a first pixel. The first pixel may include the following elements: a first electrode positioned on the first section of the first auxiliary substrate; a second electrode positioned between the first electrode and the first part of the second auxiliary substrate; and an organic light-emitting layer disposed between the first electrode and the second electrode.

The display device may include an outer black matrix overlapping the non-display area.

The outer black matrix may include a first black portion and a second black portion. The first black portion is oriented parallel to the first face of the first substrate. The second black portion overlaps a second face of the first substrate and is oriented not parallel to the first face of the first substrate.

The first section of the first auxiliary substrate may be thinner than the first part of the second auxiliary substrate in a direction perpendicular to the face of the first substrate.

An embodiment may be related to a tiled display apparatus. The tiled display apparatus may include an array of display panels. Each of the display panels may include a first substrate, a second substrate, a first auxiliary substrate, a second auxiliary substrate, and a display element layer. The second substrate may include a display area and a non-display area. The display area may overlap a first face of the first substrate. The non-display area may extend beyond the first substrate in a direction parallel to the first face of the first substrate. The first auxiliary substrate may include a first section and a second section. The first section may overlap the display area and may be positioned between the first substrate and the display area. The second section may overlap the non-display area and may be oriented at a first right-or-acute angle relative to the first section. The second auxiliary substrate may include a first part and a second part. The first part may overlap the display area and may be positioned between the first section and the display area. The second part may overlap the non-display area and may be oriented at a second right-or-acute angle relative to the first part. The display element layer may be positioned between the first section and the first part and may include pixels for displaying an image. The pixels may overlap the display area.

The display panels may include a first display panel. The first display panel may include at least one of a pixel defining layer and a black layer. A distance between two spaced and immediately neighboring portions of the pixel defining layer or of the black layer may be greater than a width of the non-display area of the first display panel. The width of the non-display area of the first display panel extends in the direction parallel to the first face of the first substrate of the first display panel from an edge of the first substrate of the first display panel to an edge of the second substrate of the first display panel.

The display panels may include a first display panel and a second display panel. The second section of the first auxiliary substrate of the first display panel may include an end of the first auxiliary substrate of the first display panel. The second section of the first auxiliary substrate of the second display panel includes an end of the first auxiliary substrate of the second display panel. The second section of the first auxiliary substrate of the first display panel may be longer than the second section of the first auxiliary substrate of the second display panel in a direction perpendicular to the first face of the first substrate of the first display panel.

The tiled display apparatus may include a driver positioned directly on the second section of the first auxiliary substrate of the first display panel and configured to supply a signal for controlling at least the pixels of the first display panel. No driver may be positioned directly on the second section of the first auxiliary substrate of the second display panel. No intervening display panel may be positioned between the first display panel and the second display panel.

The tiled display apparatus may include a first driver and a second driver. The display panels may include a first display panel and a second display panel. No intervening display panel may be positioned between the first display panel and the second display panel. The first driver may be positioned directly on the second section of the first auxiliary substrate of the first display panel and configured to provide a first signal set for controlling the pixels of the first display panel. The second driver may be positioned directly on the second section of the first auxiliary substrate of the second display panel and configured to provide a second signal set for controlling the pixels of the second display panel. At least one of the first driver and the second driver may be positioned between the second section of the first auxiliary substrate of the first display panel and the second section of the first auxiliary substrate of the second display panel.

The first section of the first auxiliary substrate may be thinner than the first part of the second auxiliary substrate in a direction perpendicular to the first face of the first substrate.

BRIEF DESCRIPTION OF THE DRAWINGS

FIG. 1 is a plan view illustrating a display device according to one embodiment.

FIG. 3 is a cross-sectional view taken along line I-I' of FIG. 1 according to one embodiment.

FIG. 7 is a plan view illustrating a tiled display apparatus according to one embodiment.

DETAILED DESCRIPTION OF EMBODIMENTS

Figure 2A:
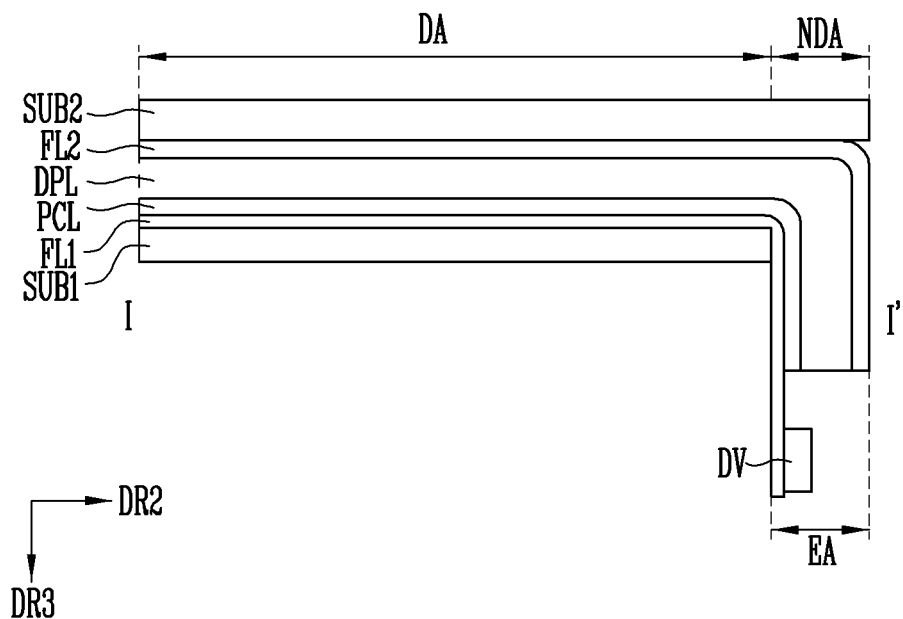
FIG. 2A is a schematic cross-sectional view taken along line I-I' of FIG. 1 according to one embodiment.

Example embodiments are described with reference to the accompanying drawings. Modifications, equivalents, and substitutions may be applicable to the example embodiments.

In describing the drawings, like reference numerals may be used for like elements. In the accompanying drawings, dimensions of structures may be exaggerated for clarity.

Although the terms "first," "second," etc. are used herein to describe various elements, these elements should not be limited by these terms. The terms are used for the purpose of distinguishing one element from another. For example, a first element could be termed a second element, and a second element could be termed a first element. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively. A single form of expression may mean one or more elements unless otherwise stated.

The terms "comprises" and/or "comprising," or "includes" and/or "including" may specify the presence of stated features, integers, steps, operations, elements, and/or components, but may not preclude the presence or addition of one or more other features, integers, steps, operations, elements, components, and/or groups.

When a first element is referred to as being "on" a second element, the first element can be "directly" or "indirectly" on the second element, with zero or more intervening elements being present between the first element and the second element. When a first element is referred to as being "directly on" a second element, no intended intervening elements (except environmental elements such as air) may be present between the first element and the second element.

When a second section/part is oriented at an angle relative to a first section/part, at least one of two opposite (parallel) faces of the second section/part may be oriented at the angle relative to at least one of two opposite (parallel) faces of the first section/part. An edge area may be a non-display area positioned at an edge of a display area. A non-display area may be an edge area or a combination of edge areas. All boundaries of each of the specified areas, all boundaries of each of the specified sections, all boundaries of each of the specified parts, and all boundaries of each of the specified portions are predetermined.

The term "connect" may mean "electrically connect." The term "insulate" may mean "electrically insulate" or "electrically isolate." The term "drive" may mean "control." The term "extend" may mean "be lengthwise." The term "contact" may mean "directly contact" or "direct contact." The term "provided" may mean "positioned."

Figure 2B:
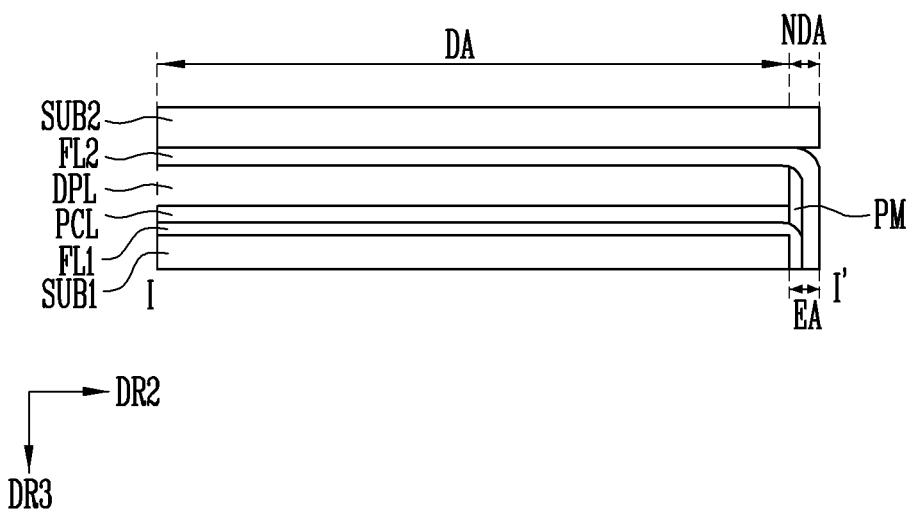
FIG. 2B is a schematic cross-sectional view taken along line I-I' of FIG. 1 according to one embodiment.

FIG. 1 is a plan view illustrating a display device according to one embodiment, and each of FIGS. 2A and 2B is a schematic cross-sectional view taken along line I-I' of FIG. 1 according to one embodiment.

Referring to FIGS. 1, 2A, and 2B, the display device may include a first substrate SUB1, a first auxiliary substrate FL1, a circuit element layer PCL, a display element layer DPL, a second auxiliary substrate FL2, and a second substrate SUB2.

The display device may have one or more of various shapes. For example, the display device may have a rectangular plate shape having two pairs of parallel sides. The display device may display visual information, such as text, a video, a photograph, or a two-dimensional or three-dimensional image in an image display direction.

The first substrate SUB1 may include a display area DA. The display area DA may overlap a plurality of pixels PXL of the display device and may be referred to as an active area.

Referring to FIG. 1, the plurality of pixels PXL may be provided in the display area DA of the display device and may be arranged in a matrix form in rows extending in a first direction DR1 and columns extending in a second direction DR2 different from the first direction DR1.

A plurality of gate lines (not shown) and a plurality of data lines (not shown) intersecting the gate lines may be provided on the display area DA of the first substrate SUB1. Each of the pixels PXL may include at least one transistor connected to one of the gate lines and one of the data lines and provided on the circuit element layer PCL. Each of the pixels PXL may include a display element connected to the transistor and provided in the display element layer DPL.

The display element may be one of a liquid crystal display element (LCD element), an electrophoretic display element (EPD element), an electrowetting display element (EWD element), and an organic light-emitting display element (OLED element).

The first substrate SUB1 may be a base substrate of the display device and may be a light transmitting substrate that is substantially transparent. The first substrate SUB1 may be a rigid substrate including glass or tempered glass, or a flexible substrate made of plastic.

The first auxiliary substrate FL1 may be provided on the first substrate SUB1. The first auxiliary substrate FL1 may support the circuit element layer PCL, the display element layer DPL, the second auxiliary substrate FL2, and the second substrate SUB2 in the display area DA and a non-display area NDA of the display device. The first auxiliary substrate FL1 may be a light transmitting substrate that is transparent and may have flexibility entirely or partially. For example, the entirety of the first auxiliary substrate FL1 may have flexibility, or an area of the first auxiliary substrate FL1 that overlaps the non-display area NDA may have flexibility.

For example, the first auxiliary substrate FL1 may be a sheet or film including a cellulose resin such as triacetyl cellulose (TAC) or diacetyl cellulose (DAC), an acrylic resin such as a cycloolefin polymer (COP), a cycloolefin copolymer (COC), or a polymethylmethacrylate (PMMA), polyolefin such as polycarbonate (PC), polyethylene (PE), or polypropylene (PP), polyester such as polyvinyl alcohol (PVA), polyethersulfone (PES), polyetheretherketone (PEEK), polyetherimide (PEI), polyethylene naphthalate (PEN), polyethylene terephthalate (PET), polyimide (PI), polysulfone (PSF), or a fluoride resin.

The circuit element layer PCL may be provided on the first auxiliary substrate FL1. The circuit element layer PCL may include lines, circuit elements, and the like for driving the pixel PXL.

The display element layer DPL may be provided on the circuit element layer PCL. Electrodes and display elements included in the pixels PXL may be provided in the display element layer DPL.

The second auxiliary substrate FL2 may be provided on the display element layer DPL. The second auxiliary substrate FL2 may support the circuit element layer PCL, the display element layer DPL, and the second substrate SUB2 in the display area DA and the non-display area NDA of the display device. The second auxiliary substrate FL2 may be a light transmitting substrate that is transparent and may have flexibility entirely or partially. For example, the entirety of the second auxiliary substrate FL2 may have flexibility, or an area of the second auxiliary substrate FL2 that overlaps the non-display area NDA may have flexibility. The material of the second auxiliary substrate FL2 may be the same as or different from that of the first auxiliary substrate FL1.

The second substrate SUB2 may be provided on the second auxiliary substrate FL2. The second substrate SUB2 may include a non-display area NDA abutting at least one side of the display area DA of the second substrate SUB2 and extending beyond at least one side of the display area DA of the first substrate SUB1. The non-display area NDA of the display device or of the second substrate SUB2 may abut (and may substantially surround) the display area DA of the display device or of the second substrate SUB2 and may be referred to as a non-active area. The non-display area NDA may be an area provided with a driver DV for driving the pixels PXL and a portion of a wiring part (not shown) connecting the pixels PXL and the driver DV.

The second substrate SUB2 may include a display area DA overlapping the display area DA of the first substrate SUB1. The whole non-display area NDA of the second substrate SUB2 may mean an area except for the display area DA of the second substrate SUB2. A "non-display area" of the second substrate SUB2 may be a part of the whole non-display area NDA of the second substrate SUB2 that abuts an edge of the display area DA of the second substrate SUB2 and may be called an edge area.

The second substrate SUB2 may be a cover substrate of the display device and may be a light transmitting substrate that is transparent. The second substrate SUB2 may be a rigid substrate including glass or tempered glass, or a flexible substrate made of plastic. The material of the second substrate SUB2 may be the same as or different from that of the first substrate SUB1.

The first auxiliary substrate FL1 and the second auxiliary substrate FL2 may include first portions overlapping the display area DA of the second substrate SUB2 and may include second portions overlapping the non-display area NDA of the second substrate SUB2.

The first auxiliary substrate FL1 and the second auxiliary substrate FL2 may overlap at least a portion of the non-display area NDA of the second substrate SUB2 and may be bent in a direction (for example, a third direction DR3) from the second substrate SUB2 to the first substrate SUB1. For example, the first auxiliary substrate FL1 and the second auxiliary substrate FL2 may be bent in the third direction DR3 to overlap one side surface of the first substrate SUB1.

Referring to FIGS. 2A and 2B, the first portions of the first auxiliary substrate FL1 and the second auxiliary substrate FL2 may extend (i.e., may be lengthwise) in a direction (for example, the second direction DR2) parallel to at least one main flat surface of the first and second substrates SUB1 and SUB2, and the second portions of the auxiliary substrates FL1 and FL2 may be bent from the first portions and may extend (i.e., may be lengthwise) in the third direction DR3.

The non-display area NDA of the second substrate SUB2 may include an edge area EA not overlapping (the display area DA of) the first substrate SUB1. Referring to FIG. 1, an edge area EA of the second substrate SUB2 may be provided along at least one edge E1, E2, E3, or E4 of the second substrate SUB2.

The edge area EA of the second substrate SUB2 may protrude beyond the first substrate SUB1 in the first direction DR1 or in the second direction DR2.

The second portions of the first auxiliary substrate FL1 and the second auxiliary substrate FL2 may overlap the edge area EA and may be substantially easily bent in the third direction DR3 in the edge area EA. The first substrate SUB1 and the second substrate SUB2 may not be bent in the edge area EA, and the first auxiliary substrate FL1 and the second auxiliary substrate FL2 may be bent in the third direction DR3. As a result, the non-display area NDA of the display device may be minimized. In embodiments, it is possible to prevent cracks or damages in the first substrate SUB1 and the second substrate SUB2, which are not bent in the edge area EA.

Each of the first auxiliary substrate FL1 and the second auxiliary substrate FL2 may be thinner than each of the first substrate SUB1 and the second substrate SUB2 in the third direction DR3 in the display area DA of the display device.

Referring to FIGS. 2A and 2B, the first substrate SUB1 and the second substrate SUB2 may not be bent, and the first auxiliary substrate FL1 and the second auxiliary substrate FL2 may be bent in the non-display area NDA (for example, the edge area EA) of the second substrate SUB2. The first and second auxiliary substrates FL1 and FL2 that are thinner than the first and second substrates SUB1 and SUB2 may be bent in the edge area EA, thereby effectively reducing the non-display area NDA of the display device.

The thickness of the first auxiliary substrate FL1 may be smaller than the thickness of the second auxiliary substrate FL2 in the third direction DR3 in the display area DA of the display device. Referring to FIGS. 2A and 2B, the first auxiliary substrate FL1 is bent at the inner edge of the edge area EA, and the second auxiliary substrate FL2 is bent at the outer edge of the edge area EA. A radius of curvature of a bent portion of the first auxiliary substrate FL1 is smaller than a radius of curvature of a bent portion of the second auxiliary substrate FL2. The first auxiliary substrate FL1 may be thinner than the second auxiliary substrate FL2, for preventing the first auxiliary substrate FL1, the circuit element layer PCL, the display element layer DPL, and the second auxiliary substrate FL2 from being detached from each other in the edge area EA.

The first and second auxiliary substrates FL1 and FL2 may be more flexible than the first and second substrates SUB1 and SUB2. The rigid first and second substrates SUB1 and SUB2 may not be bent, and the flexible first and second auxiliary substrates FL1 and FL2 may be bent in the non-display area NDA (for example, the edge area EA). As a result, it is possible to prevent cracks or damages from occurring in the first substrate SUB1 and the second substrate SUB2, for improving durability of the display device.

FIG. 2A shows that the first auxiliary substrate FL1, the circuit element layer PCL, the display element layer DPL, and the second auxiliary substrate FL2 are bent in the edge area EA in the third direction DR3. FIG. 2B shows that only the first auxiliary substrate FL1 and the second auxiliary substrate FL2 are bent in the edge area EA in the third direction DR3.

The first and second auxiliary substrates FL1 and FL2 may support portions of the circuit element layer PCL and the display element layer DPL that are bent in the non-display area NDA (for example, the edge area EA) in the third direction DR3. Referring to FIG. 2A, the first and second auxiliary substrates FL1 and FL2 may be bent in the third direction DR3 together with the circuit element layer PCL and the display element layer DPL and thus may effectively support the portions of the circuit device layer PCL and the display device layer DPL that are bent in the edge area EA.

Referring to FIG. 2B, an edge of the circuit element layer PCL and the display element layer DPL may be positioned at a boundary between the display area DA and the non-display area NDA of the second substrate SUB2. Only the first and second auxiliary substrates FL1 and FL2 may be bent in the non-display area NDA (for example, the edge area EA) in the third direction DR3. Including no portions of the layers PCL and DPL, the non-display area NDA of the display device may be minimized. A packing material PM may fill a separation space between edges of the circuit element layer PCL and the display element layer DPL and the second auxiliary substrate FL2. The packing material PM may be a transparent material and may be adhesive.

The driver DV configured to supply a signal for driving the pixels PXL may be provided on the first auxiliary substrate FL1. Referring to FIGS. 1 and 2A, the driver DV may be provided on the second portion of the first auxiliary substrate FL1, which may overlap the edge area EA provided at a first edge E1 of the second substrate SUB2. The driver DV may be provided at least one edge area EA provided at one or more of first to fourth edges E1 to E4 of the second substrate SUB2. For example, the driver DV may be provided only at the edge area EA of the first edge E1, at the edge areas EA of the first edge E1 and the second edge E2, or at all of the edge areas EA of the first to fourth edges E1 to E4.

The driver DV may be mounted on a driving board (not shown) provided on the first auxiliary substrate FL1, and the driving board may be a printed circuit board (PCB). The driver DV may have a form of an integrated circuit chip, and the pixels PXL may receive a driving signal from the driver DV through a driving driver (not shown).

The first auxiliary substrate FL1 may be bent once more to a lower surface of the first substrate SUB1. The first auxiliary substrate FL1 may further include a third portion bent from the second portion to the display area DA. The third portion may overlap the first portion of the first auxiliary substrate FL1, such that the first substrate SUB1 may be interposed between the third portion of the first auxiliary substrate FL1 and the first portion of the first auxiliary substrate FL1.

In this case, the driver DV may overlap the display area DA.

The driver DV may be formed directly on the first auxiliary substrate FL1. For example, The driver DV may be formed concurrently in a process of forming the circuit element layer PCL on the first auxiliary substrate FL1. As a result, the driver DV may be provided on the first auxiliary substrate FL1 without using an anisotropic conductive film (ACF) for attaching the driver DV, for simplifying the process of manufacturing the display device and reducing manufacturing costs.

Figure 4A:
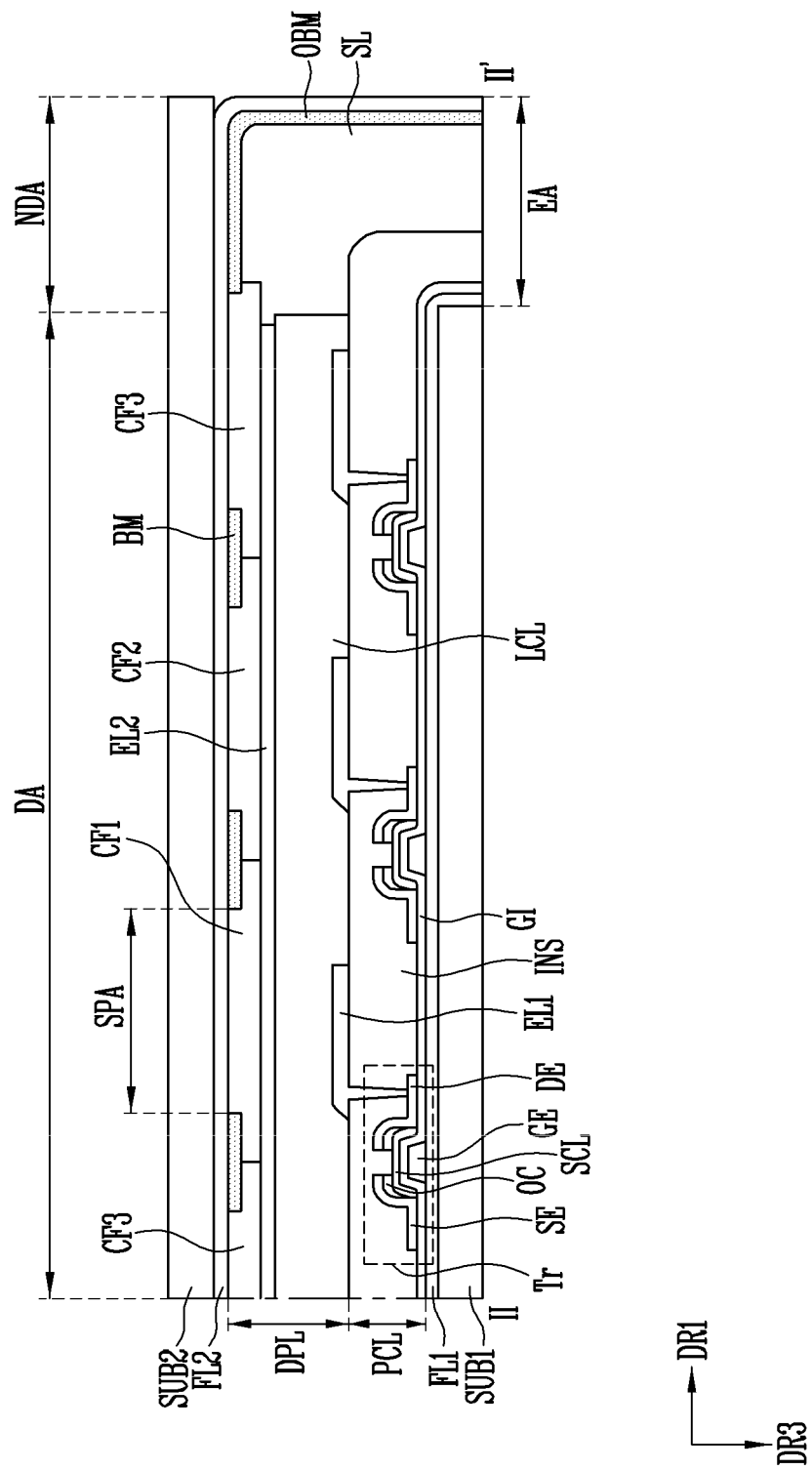
FIG. 4A is a cross-sectional view taken along line II-II' of FIG. 1 according to one embodiment.
Figure 4B:
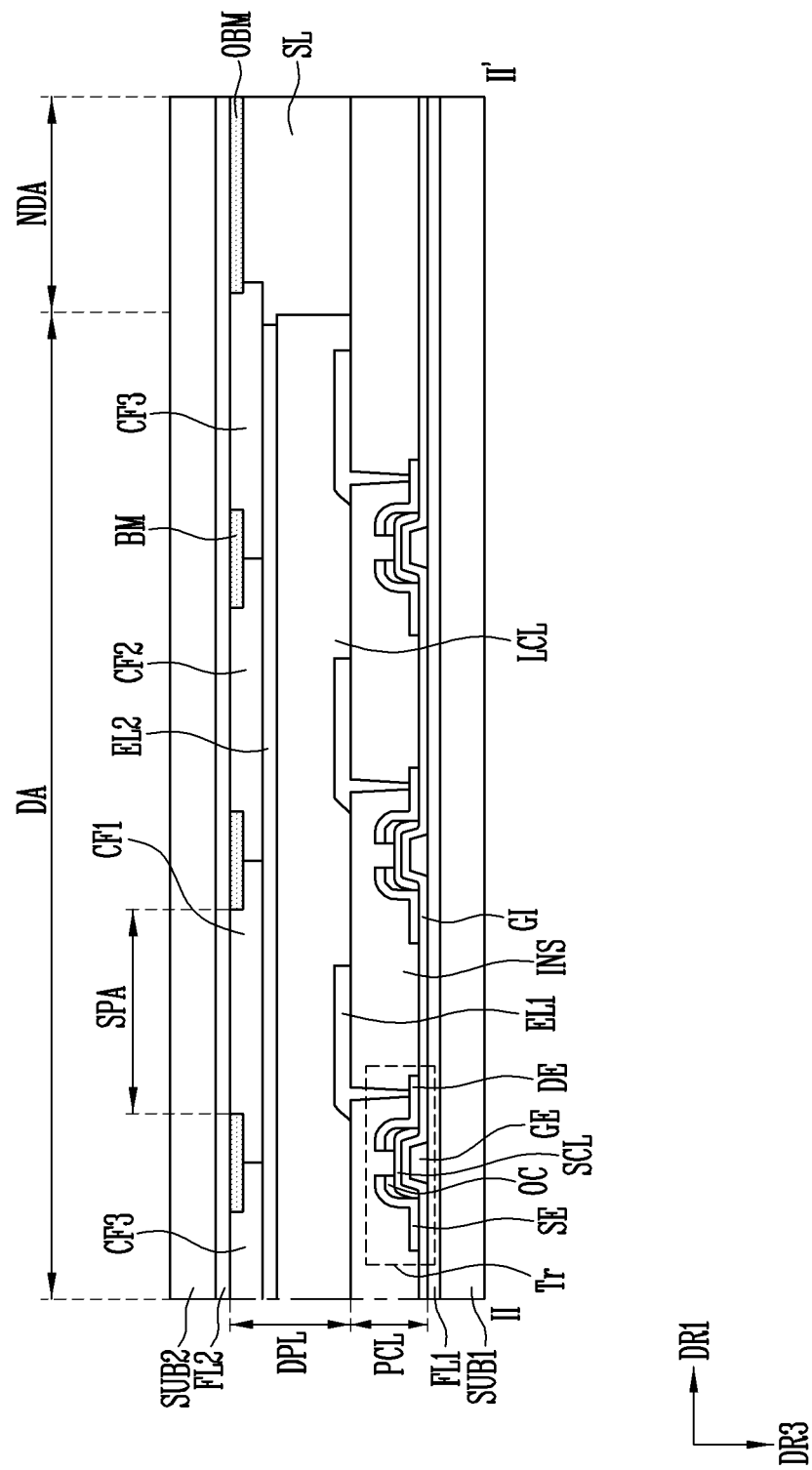
FIG. 4B is a cross-sectional view taken along line II-II' of FIG. 1 according to one embodiment.

FIG. 3 is a cross-sectional view taken along line I-I' of FIG. 1 according to one embodiment, and each of FIGS. 4A and 4B is a cross-sectional views taken along line II-II' of FIG. 1 according to one embodiment. The display device is an LCD device.

Referring to FIGS. 3, 4A, and 4B, the display device may include a first substrate SUB1, a first auxiliary substrate FL1, a circuit element layer PCL, a display element layer DPL, a second auxiliary substrate FL2, and a second substrate SUB2.

The circuit element layer PCL may include a transistor Tr, a liquid crystal capacitor (not shown), and a storage capacitor (not shown) for driving pixels PXL. The storage capacitor may be optional.

The transistor Tr may include a semiconductor layer SCL, a gate electrode GE, a source electrode SE, a drain electrode DE, and ohmic contact layers OC. The ohmic contact layers OC may be optional.

The gate electrode GE may be provided on the first auxiliary substrate FL1. The corresponding semiconductor layer SCL may overlapping the gate electrode GE with the gate insulating layer GI interposed between the gate electrode GE and the semiconductor layer SCL.

The semiconductor layer SCL may include a source region and a drain region that respectively contact the source electrode SE and the drain electrode DE. A region between the source region and the drain region may be a channel region. The semiconductor layer SCL may be made of polysilicon, amorphous silicon, an oxide semiconductor, or the like. The channel region may be doped with impurities. N-type impurities, p-type impurities, or other metals may be used as the impurities.

The ohmic contact layers OC may be made of n+ hydrogenated amorphous silicon in which silicide or n-type impurities are doped at a high concentration and may be provided on the semiconductor layer SCL.

The source electrode SE and the drain electrode DE may be provided on the ohmic contact layers OC. The source electrode SE may contact the source region of the semiconductor layer SCL, and the drain electrode DE may contact the drain region of the semiconductor layer SCL.

The circuit element layer PCL may include an insulating layer INS covering the transistors Tr. The insulating layer INS may include at least one of an inorganic insulating film made of an inorganic material and an organic insulating film made of an organic material. For example, the insulating layer INS may include the inorganic insulating film and the organic insulating film provided on the inorganic insulating film.

Each of the pixels PXL provided in the display element layer DPL may include a first electrode EU provided on the first auxiliary substrate FL1 and on the circuit element layer PCL, a second electrode EL2 overlapping the first electrode EL1, and a liquid crystal layer LCL disposed between the first electrode EL1 and the second electrode EL2. In addition, the display element layer DPL may include a sealant SL and a black matrix BM.

Referring to FIGS. 3, 4A, and 4B, the first electrode EL1 may be provided on the insulating layer INS of the circuit element layer PCL. The first electrode EL1 may be electrically connected to the drain electrode DE of the transistor Tr through a contact hole passing through the insulating layer INS. The first electrode EL1 may be a pixel electrode of a liquid crystal display device.

The liquid crystal layer LCL may be provided on the first electrode EL1 and the insulating layer INS, and the second electrode EL2 may be provided on the liquid crystal layer LCL. The second electrode EL2 may be a common electrode of the liquid crystal display device. The display element layer DPL may include the sealant SL surrounding the liquid crystal layer LCL. The liquid crystal layer LCL may fill a space between the first electrode EL1 and the second electrode EL2.

A backlight unit (not shown) is provided on a lower surface of the first substrate SUB1, and light supplied from the backlight unit may be emitted in a direction from the first substrate SUB1 to the second substrate SUB2.

When a data signal and a common voltage are applied to the first electrode EL1 and the second electrode EL2 to generate a certain electric field, a liquid crystal alignment angle of the liquid crystal layer LCL may be changed, and thus, transmittance of the light supplied from the backlight unit may be adjusted to display an image on the display device.

Color filters CF and the black matrix BM may be provided on the second electrode EL2. The color filters CF may include first, second, and third color filters CF1, CF2, and CF3 which overlap the corresponding first electrodes EL1. Wavelengths of light beams emitted from the first, second, and third color filters CF1, CF2, and CF3 may be different from each other. For example, the first color filter CF1 may emit light having a red wavelength from incident light. The second color filter CF2 may emit light having a green wavelength from incident light. The third color filter CF3 may emit light having a blue wavelength from incident light.

Each of the pixels PXL may include subpixel areas SPA that output light beams having different colors. Referring to FIGS. 3, 4A, and 4B, portions of the black matrix BM may be provided at each of boundaries between the first color filter CF1, the second color filter CF2, and the third color filter CF3, and thus, the subpixel areas SPA of the pixels PXL may be distinguished. For example, the subpixel area SPA may be between two spaced and immediately adjacent portions of the black matrix BM.

The subpixel area SPA overlapping the first color filter CF1 may output light having a red wavelength. The subpixel area SPA overlapping the second color filter CF2 may output light having a green wavelength. The subpixel area SPA overlapping the third color filter CF3 may output light having a blue wavelength.

A width of the edge area EA is smaller than a width of the subpixel areas SPA in the second direction DR2 or the first direction DR1. Referring to FIGS. 3 to 4B, the width of the edge area EA may be smaller than the width of the subpixel areas SPA in a second direction DR2, and thus, the non-display area NDA of the display device may be minimized.

At least a portion of the non-display area NDA of the second substrate SUB2 may include the edge area EA. The edge area EA may be provided along an edge of the second substrate SUB2. For example, the edge area EA may be provided at a first edge E1 of the second substrate SUB2, may be provided at the first edge E1 and a second edge E2, or may be provided at all of first, second, third, and fourth edges E1, E2, E3, and E4.

Referring to FIGS. 1 and 3, the edge area EA may be provided at the first edge E1 of the second substrate SUB2. A driver DV may be provided on the first auxiliary substrate FL1 corresponding to the edge area EA.

Referring to FIGS. 1 and 4A, the edge area EA may be provided in the non-display area NDA provided at the second edge E2 of the second substrate SUB2. No driver DV may be provided at the edge area EA of the second edge E2 of the second substrate SUB2.

Referring to FIGS. 1 and 4B, no edge area EA may be provided at the second edge E2 of the second substrate SUB2. At the second edge E2 of the second substrate SUB2, the first and second auxiliary substrates FL1 and FL2 may not be bent in a third direction DR3.

The sealant SL may overlap the non-display area NDA of the second substrate SUB2. The sealant SL may overlap the edge area EA of the second substrate SUB2. The sealant SL may surround the liquid crystal layer LCL. Referring to FIG. 4B, the sealant SL may be provided in the non-display area NDA. The sealant SL may be provided in the non-display area NDA (for example, the edge area EA) of the second substrate SUB2, for securing the liquid crystal layer LCL in the display area DA of the display device.

The display element layer DPL may include an outer black matrix OBM provided in the non-display area NDA. The edge area EA may overlap the outer black matrix OBM.

The outer black matrix OBM may include a first portion extending in a direction parallel to a main flat surface of the second substrate SUB2, on which the second auxiliary substrate FL2 is provided, and may include a second portion extending in a direction from the second substrate SUB2 to the first substrate SUB1.

Referring to FIGS. 3 and 4A, the display element layer DPL may include the black matrix BM overlapping the display area and may include the outer black matrix OBM overlapping the non-display area NDA. The outer black matrix OBM may include the first portion extending in the second direction DR2 and may include the second portion extending in the third direction DR3. The outer black matrix OBM may minimize light leakage and may minimize penetration of external light.

Figure 5:
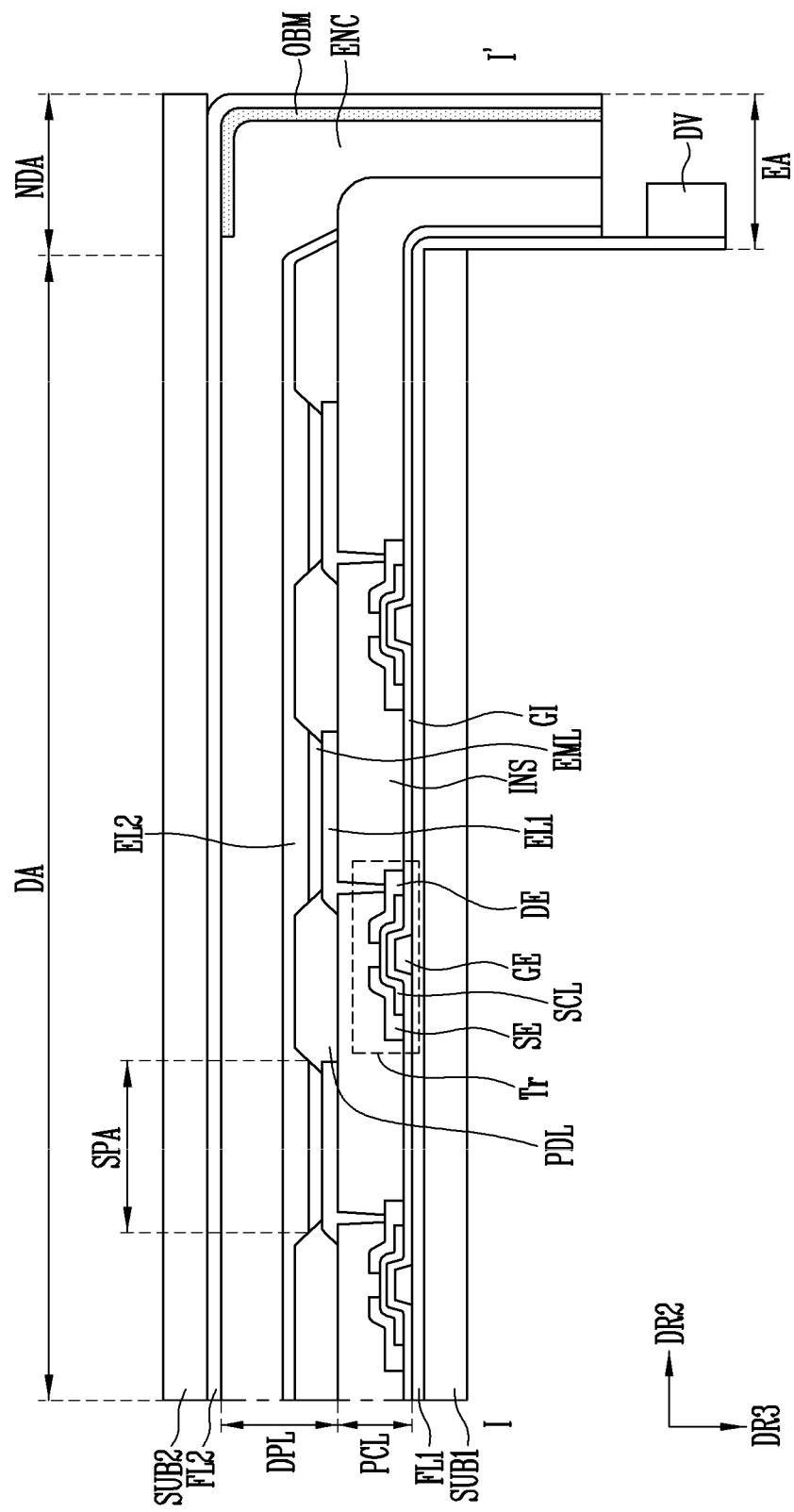
FIG. 5 is a cross-sectional view taken along line I-I' of FIG. 1 according to an embodiment.
Figure 6:
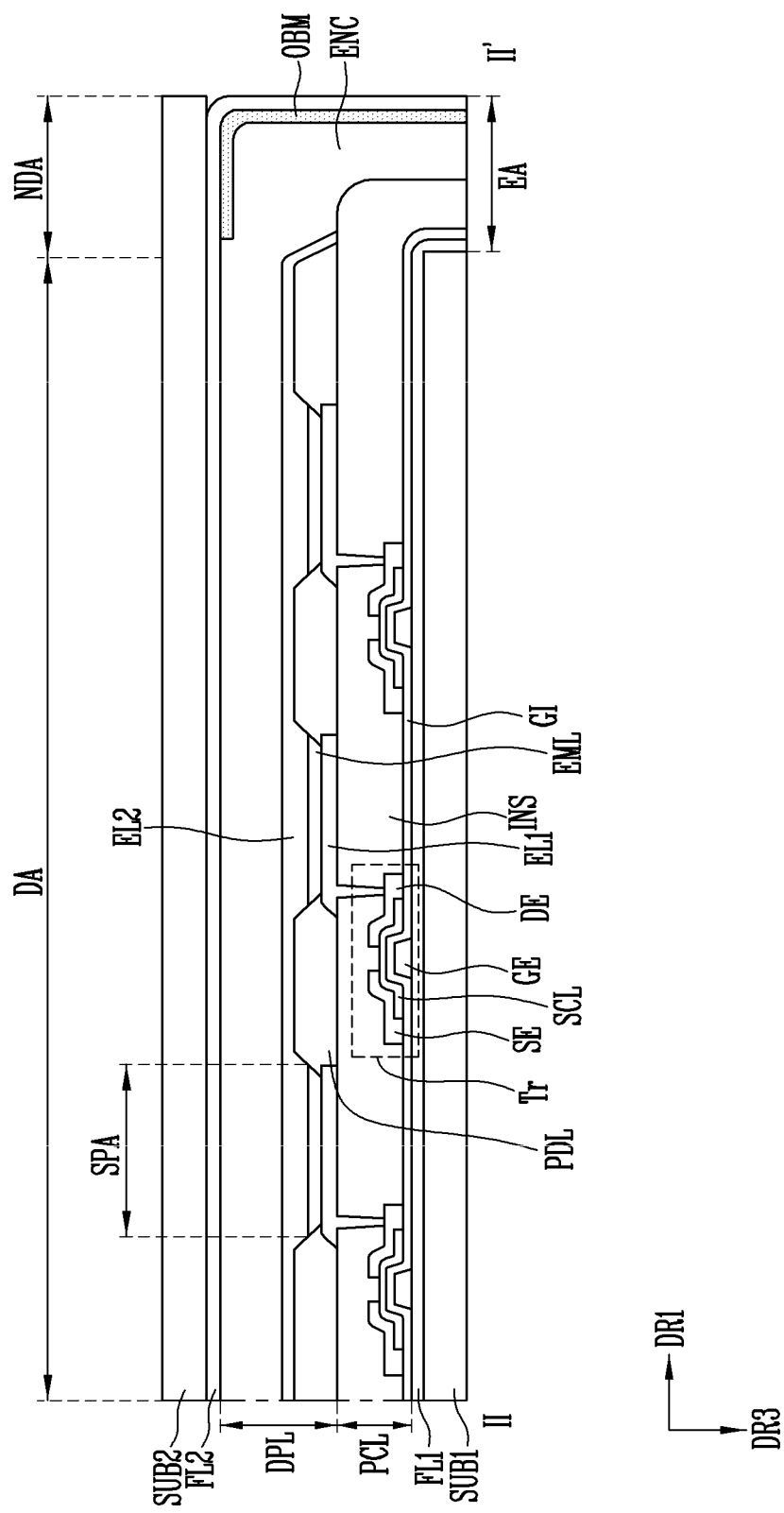
FIG. 6 is a cross-sectional view taken along line II-II' of FIG. 1 according to an embodiment.

FIG. 5 is a cross-sectional view taken along line I-I' of FIG. 1 according to an embodiment, and FIG. 6 is a cross-sectional view taken along line II-II' of FIG. 1 according to an embodiment. The display device is an OLED display device.

Referring to FIGS. 5 and 6, the display device may include a first substrate SUB1, a first auxiliary substrate FL1, a circuit element layer PCL, a display element layer DPL, a second auxiliary substrate FL2, and a second substrate SUB2.

The circuit element layer PCL may include a driving transistor Tr, a switching transistor (not shown), a storage capacitor (not shown), and the like. The driving transistor Tr may include a semiconductor layer SCL, a gate electrode GE, a source electrode SE, and a drain electrode DE.

Referring to FIGS. 5 and 6, the gate electrode GE may be provided on the first auxiliary substrate FL1. The corresponding semiconductor layer SCL may be provided on the gate electrode GE with the intervening gate insulating layer GI. The semiconductor layer SCL may include a source region, a drain region, and a channel region provided between the source region and the drain region. The source electrode SE and the drain electrode DE may be provided on the semiconductor layer SCL. The source electrode SE may contact the source region, and the drain electrode DE may contact the drain region.

The circuit element layer PCL may include an insulating layer INS covering the transistors. The insulating layer INS may include at least one of an inorganic insulating film made of an inorganic material and an organic insulating film made of an organic material.

Each of pixels PXL provided in the display element layer DPL may include a first electrode EU provided on the first auxiliary substrate FL1 and on the circuit element layer PCL, a second electrode EL2 overlapping the first electrode EL1, and an organic light-emitting layer ELM disposed between the first electrode EL1 and the second electrode EL2. The display device layer DPL may include an encapsulation layer ENC and an outer black matrix OBM.

The first electrode EL1 may be provided on the insulating layer INS of the circuit element layer PCL. The first electrode EU may be electrically connected to the drain electrode DE of the driving transistor Tr through a contact hole passing through the insulating layer INS.

The first electrode EL1 may include a reflective film (not shown) made of one or more of gold (Au), platinum (Pt), nickel (Ni), tungsten (W), chromium (Cr), molybdenum (Mo), iron (Fe), cobalt (Co), copper (Cu), palladium (Pd), and titanium (Ti). The first electrode EL1 may further include a transparent film (not shown) made of indium tin oxide (ITO), indium zinc oxide (IZO), or the like, which has a high work function. The first electrode EL1 may serve as an anode electrode.

The second electrode EL2 may be a transparent electrode. The second electrode EL2 may be a thin semi-transparent film (not shown) made of one or more metals having a low work function, such as alkali metals, such as lithium (Li) and cesium (Cs), and alkaline earth metals, such as magnesium (Mg), calcium (Ca), and strontium (Sr). The second electrode EL2 may further include a transparent conductive film (not shown) formed on or below the metal semi-transparent film using at least one of indium tin oxide (ITO) and indium zinc oxide (IZO). The second electrode EL2 may serve as a cathode electrode.

The organic light-emitting layer EML may be provided between the first electrode and the second electrode. Although not shown in FIGS. 5 and 6, a hole transfer layer and a hole injection layer may be formed between the first electrode EL1 and the organic light-emitting layer EML. In addition, an electron transport layer and an electron injection layer may be formed between the organic light-emitting layer EML and the second electrode EL2. The organic light-emitting layer EML may include a red light-emitting layer (not shown), a green light-emitting layer (not shown), and a blue light-emitting layer (not shown).

Pixel defining layers PDL (or portions of a pixel defining layer PDL) may be formed between first electrodes EL1, may overlap ends of the first electrodes EL1, and may divide subpixel areas SPA that respectively correspond to the first electrodes EL1. For example, a subpixel area SPA may be an area of an organic light-emitting layer EML between two spaced and immediately neighboring pixel defining layers PDL (or two spaced and immediately adjacent portions of the pixel defining layer PDL).

Subpixel areas SPA may output light of different colors. A subpixel area SPA including a red light-emitting layer may output light having a red wavelength, a subpixel area SPA including a green light-emitting layer may output light having a green wavelength, and a subpixel area SPA including the blue light-emitting layer may output light having a blue wavelength. Subpixel areas SPA of different colors may be sequentially disposed in the second direction DR2. A width of an edge area EA may be smaller than a width of the subpixel areas SPA in the second direction DR2, and thus, a non-display area NDA of the display device may be effectively minimized.

The display element layer DPL may include the encapsulation layer ENC provided on the second electrode EL2. The encapsulation layer ENC may include organic material layers (not shown) and inorganic material layers (not shown) that are alternately stacked.

Referring to FIGS. 1 and 5, the edge area EA may be provided at a first edge E1 of the second substrate SUB2. A driver DV may be provided on the first auxiliary substrate FL1 corresponding to the edge area EA.

Referring to FIGS. 1 and 6, the edge area EA may be provided at a second edge E2 of the second substrate SUB2. No driver DV may be provided at the edge area EA of the second edge E2 of the second substrate SUB2. A driver DV may be provided on the first auxiliary substrate FL1 corresponding to the edge area EA.

Referring to FIGS. 5 and 6, the display element layer DPL may include the outer black matrix OBM provided in the non-display area NDA, and the edge area EA may overlap the outer black matrix OBM. The outer black matrix OBM may include a first portion extending in the second direction DR2 and a second portion extending in a third direction DR3, for minimizing a light leakage and penetration of external light.

FIG. 7 is a plan view illustrating a tiled display apparatus according to one embodiment, and each of FIGS. 8A, 8B, 8C, and 8D is a cross-sectional views taken along line III-III' of FIG. 7 according to one embodiment.

Figure 8A:
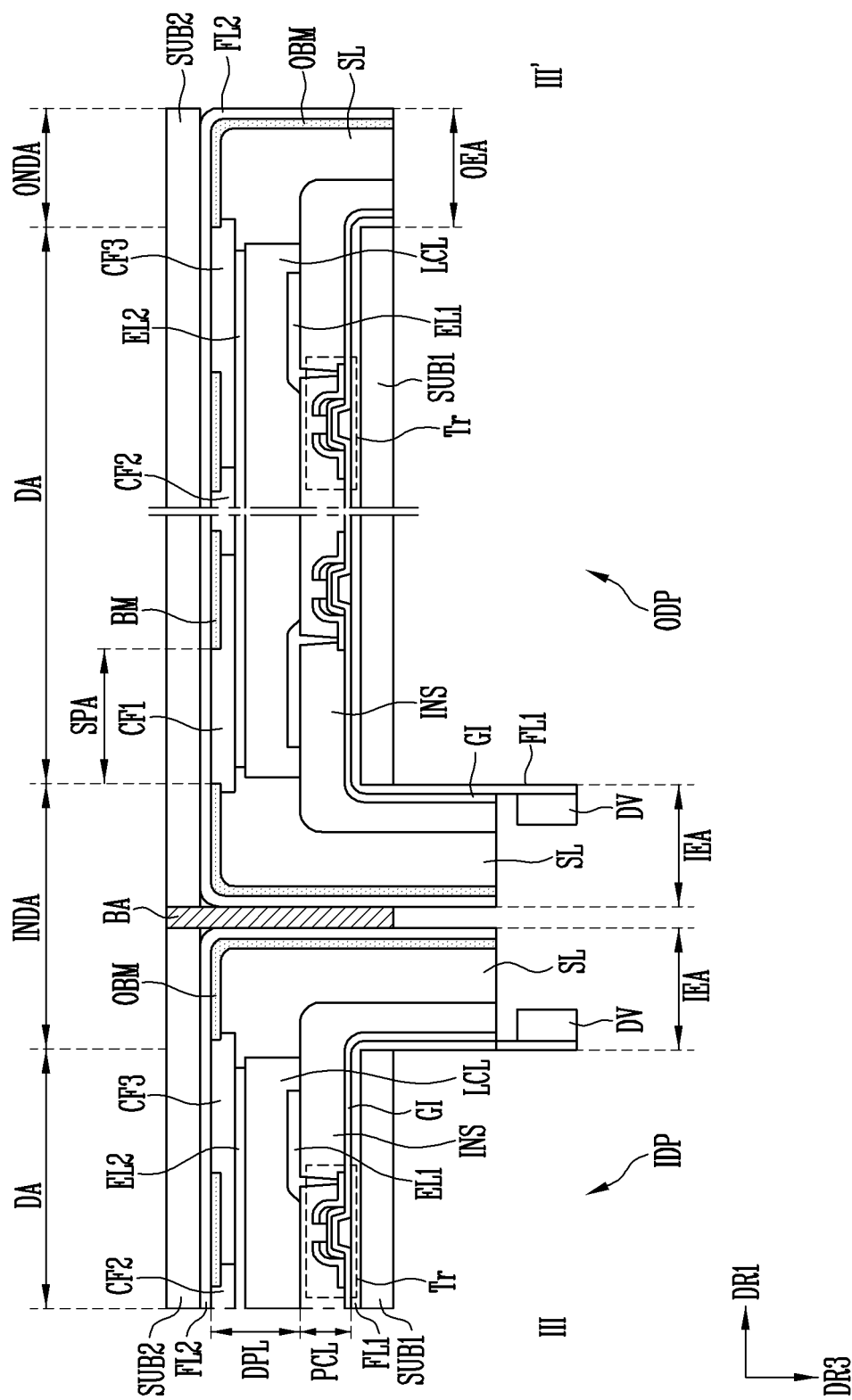
FIG. 8A is a cross-sectional view taken along line III-III' of FIG. 7 according to one embodiment.
Figure 8B:
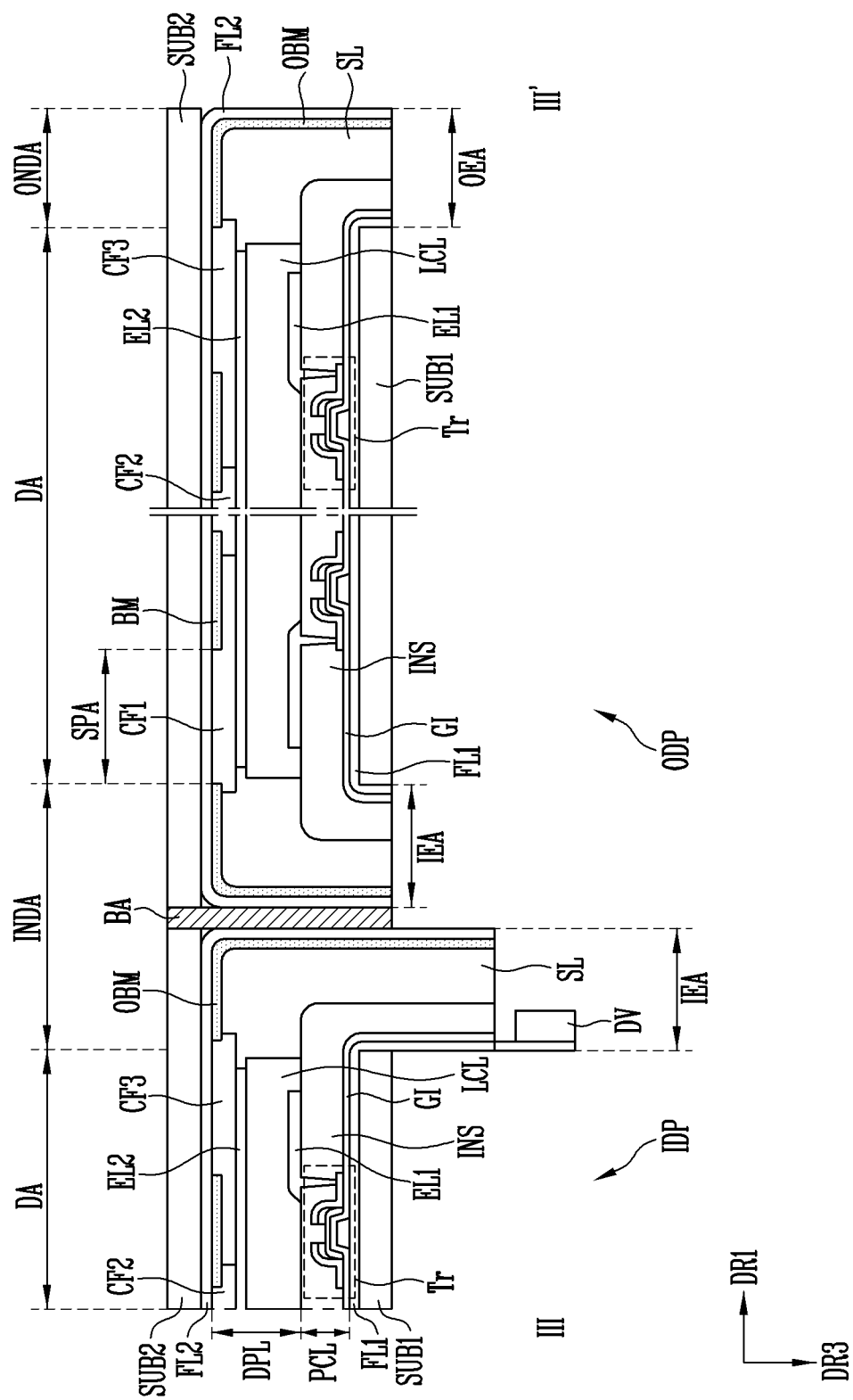
FIG. 8B is a cross-sectional view taken along line III-III' of FIG. 7 according to one embodiment.
Figure 8C:
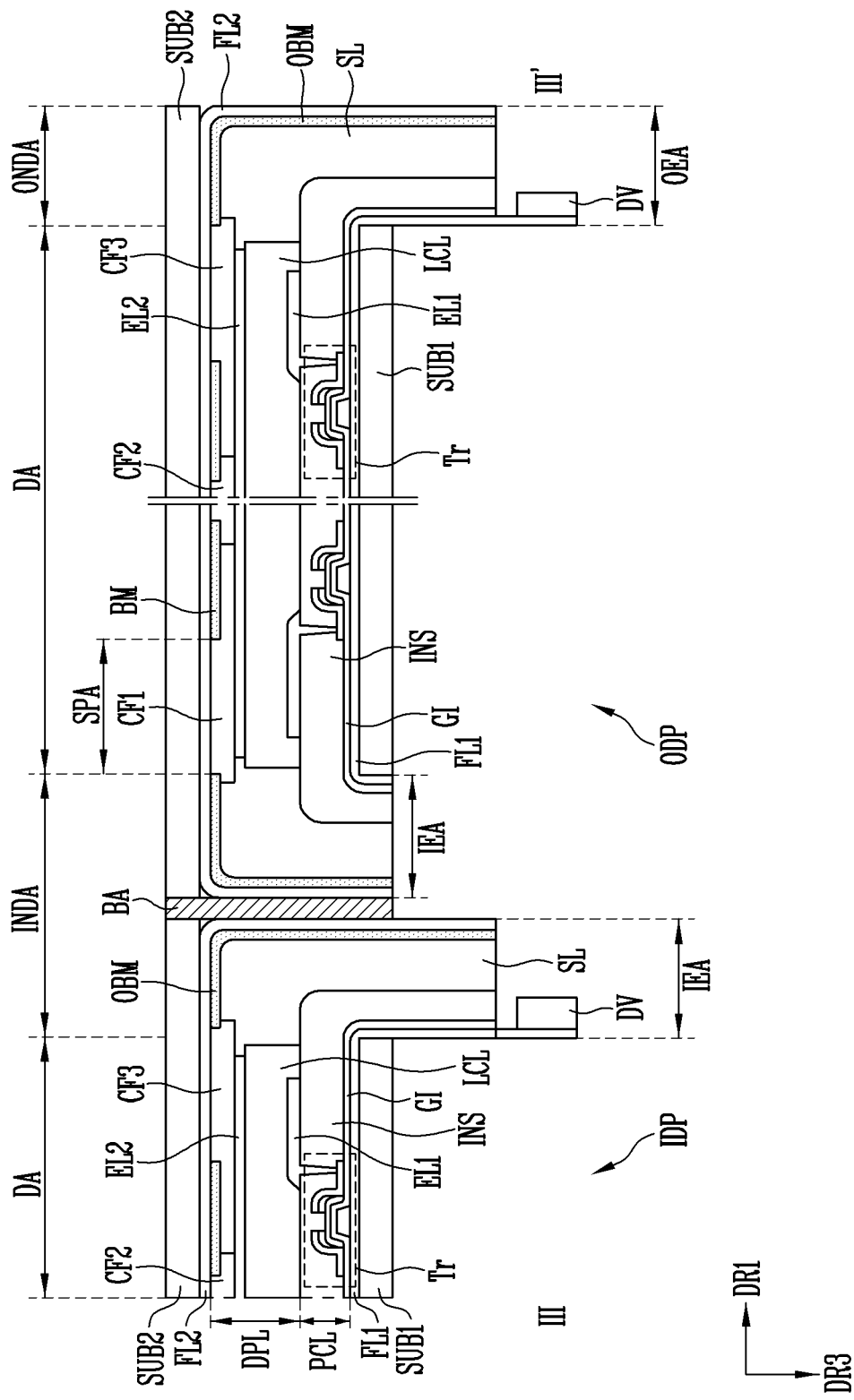
FIG. 8C is a cross-sectional view taken along line III-III' of FIG. 7 according to one embodiment.
Figure 8D:
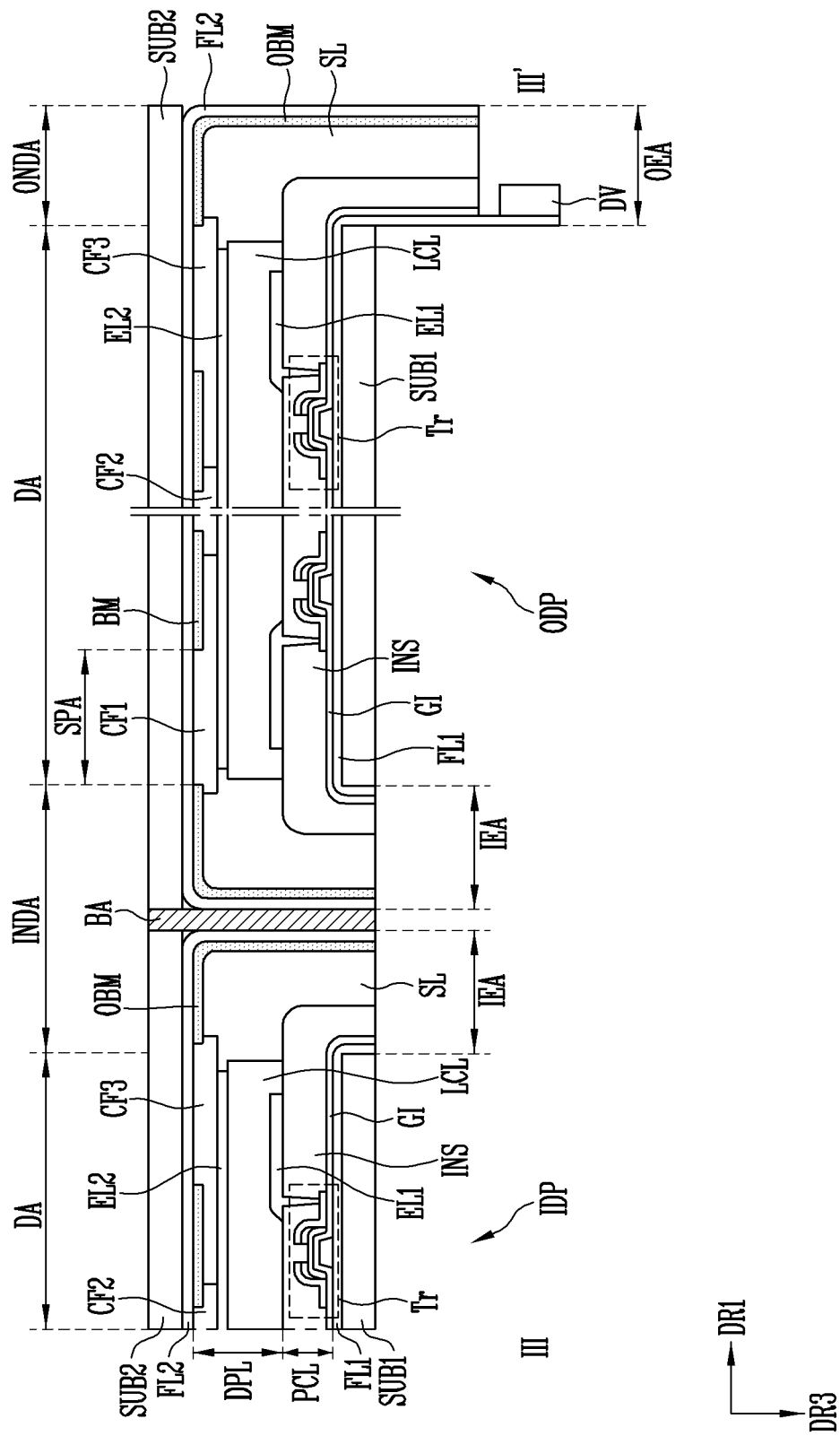
FIG. 8D is a cross-sectional view taken along line III-III' of FIG. 7 according to one embodiment.

Referring FIGS. 7 to 8D, the tiled display apparatus may include a plurality of display panels DP. For example, the tiled display apparatus may be formed by connecting two or more display panels DP. In FIG. 7, the display panels DP are illustrated as being connected to each other in a 3×3 array. The array and the number of the display panels DP included in the tiled display apparatus may be configured according to embodiments.

The display panels DP included in the tiled display apparatus may contact each other, may be mounted in a chassis, or may be connected through a separate coupling portion.

FIG. 8A to 8D illustrate that a buffer material BA is provided between the display panels DP. In embodiments, the display panels DP may be connected through a transparent adhesive or transparent tape.

The display panels DP included in the tiled display apparatus may independently output different images and/or may share one image and respectively output portions of the images.

The display panels DP may include LCD display panels, OLED display panels, and/or other display panels.

Referring to FIGS. 7 to 8D, the tiled display apparatus may include an inner display panel IDP which is positioned at an inner side of the array of the display panels DP and of which all of edges are surrounded by other display panels DP. In addition, the tiled display apparatus may include an outer display panel ODP which is positioned at an outer side of the array of display panels DP and of which at least one of edges is exposed to the outside.

Referring to FIGS. 8A to 8D, each of the display panels DP may include a first substrate SUB1, a first auxiliary substrate FL1, a circuit element layer PCL, a display element layer DPL, a second auxiliary substrate FL2, and a second substrate SUB2.

Non-display areas NDA (for example, an inner non-display area INDA) of the second substrates SUB2 adjacent to each other between the display panels DP may include edge areas EA (for example, inner edge areas IEA) which do not overlap the first substrates SUB1. The inner non-display area INDA may include non-display areas NDA provided at edges of the display panels DP adjacent to each other in the array of the display panels DP. An inner edge area IEA may overlap the inner non-display area INDA and may be an edge area EA provided in a second substrate SUB2.

The first auxiliary substrates FL1 and the second auxiliary substrates FL2 of the display panels DP that are adjacent to each other may be bent in the inner edge area IEA in a third direction DR3. As shown in FIGS. 8A to 8D, the first auxiliary substrates FL1 and the second auxiliary substrates FL2 may be bent in the third direction DR3 and may overlap side surfaces of the first substrates SUB1.

The first and second auxiliary substrates FL1 and FL2 are bent in the inner edge area IEA, for minimizing the inner non-display area INDA positioned at the boundary between the display panels DP. As a result, a visible seam phenomenon displayed between the display panels DP may minimized.

The second substrates SUB2 of the outer display panels ODP of the tiled display apparatus may include outer non-display areas ONDA provided along edges exposed to the outside. The outer non-display area ONDA of the second substrate SUB2 may include an outer edge area OEA that does not overlap the first substrate SUB1. An outer edge area OEA may overlap the outer non-display area ONDA and may be an edge area EA provided in the second substrate SUB2.

The first auxiliary substrates FL1 and the second auxiliary substrates FL2 of the display panels DP may be bent in the outer edge area OEA in the third direction DR3. The first and second auxiliary substrates FL1 and FL2 are bent in the outer edge area OEA, for reducing the non-display area NDA of the display panels DP to minimize the overall area of the tiled display apparatus.

Some or all of the outer non-display area ONDA may include an outer edge area OEA.

Referring to FIGS. 7 and 8D, an inner edge area IEA of the second substrate SUB2 may protrude beyond the first substrate SUB1 in the first direction DR1 or the second direction DR2. An outer edge area OEA of the second substrate SUB2 may protrude beyond the first substrate SUB1 in the first direction DR1 or the second direction DR2.

A driver DV configured to supply a signal for driving pixels PXL may be provided on the first auxiliary substrate FL1. For example, in an inner display panel IDP, the driver DV may be provided in at least one area of the inner edge areas IEA. In an outer display panel ODP, the driver DV may be provided in at least one area of the inner edge area IEA and the outer edge area OEA.

Referring to FIGS. 7 and 8A, drivers DV may be provided in the inner edge areas IEA positioned between the display areas DA of the inner display panel IDP and the outer display panel ODP. Referring to FIGS. 7 and 8B, a driver DV may be provided in the inner edge area IEA of the inner display panel IDP. FIG. 8B illustrates that no driver DV may be provided in the inner edge area IEA and the outer edge area OEA of the outer display panel ODP, but a driver DV may be provided in an inner edge area IEA of the outer display panel ODP.

Referring to FIGS. 7 and 8C, two drivers DV may be respectively provided in the inner edge area IEA of the inner display panel IDP and the outer edge area OEA of the outer display panel ODP. Referring to FIGS. 7 and 8D, a driver DV may be provided in the outer edge area OEA of the outer display panel ODP. FIG. 8D illustrates that no driver DV may be provided in the inner edge area IEA of the inner display panel IDP, but a driver DV may be disposed in another inner edge area IEA of the inner display panel IDP.

One or more positions of one or more drivers DV may be configured according to embodiments. For example, the first auxiliary substrate FL1 may be bent once more to a lower surface of the first substrate SUB1. The first auxiliary substrate FL1 may further include a third portion bent from the second portion to the display area DA. The third portion may overlap the first portion of the first auxiliary substrate FL1. The driver DV may overlap the display area DA.

Referring to FIGS. 8A to 8D, each of the widths of the edge areas IEA and OEA may be smaller than a width of a subpixel area SPA in a first direction DR2. As a result, a visible seam may be minimized, and the overall area of the display device may be minimized.

The display element layer DPL of each of the display panels DP may include an outer black matrix OBM overlapping the corresponding edge area EA. For example, an outer black matrix OBM may overlap each of an inner edge area IEA of an inner display panel IDP, an inner edge area IEA of an outer display panels ODP, and an outer edge area OEA of the outer display panels ODP.

Referring to FIGS. 8A to 8D, an outer black matrix OBM may include a first portion extending in the first direction DR1 and a second portion extending in the third direction DR3. An outer black matrix OBM including the first portion and the second portion may be provided in an inner edge area IEA, for preventing light from being influenced between the adjacent display panels DP. In addition, an outer black matrix OBM including the first portion and the second portion may be provided in an outer edge area OEA, for minimizing light leakage and minimizing penetration of external light.

According to embodiments, a display device may have a minimized bezel corresponding to a minimized non-display area. Display devices identical to or analogous the display device may be included in a tiled display apparatus.

According to embodiments, visible seams between display panels included in a tiled display apparatus may be minimized.

Although example embodiments have been described, various combinations, modifications, and environments may be applicable to the described embodiments for other practical embodiments. All practical embodiments are within the scope of the appended claims.

What is claimed is:

1. A display device comprising:
a first substrate;
a second substrate including a display area and a non-display area, wherein the display area overlaps a first face of the first substrate, and wherein the non-display area extends beyond the first substrate in a direction parallel to the first face of the first substrate;
a first auxiliary substrate including a first section and a second section, wherein the first section overlaps the display area and is positioned between the first substrate and the display area, and wherein the second section overlaps the non-display area and is oriented at a first right-or-acute angle relative to the first section;
a second auxiliary substrate including a first part and a second part, wherein the first part overlaps the display area and is positioned between the first section and the display area, and wherein the second part overlaps the non-display area and is oriented at a second right-or-acute angle relative to the first part; and
a display element layer positioned between the first section and the first part and including pixels for displaying an image, wherein the pixels overlap the display area.

2. The display device of claim 1, wherein the second section is oriented at the first right-or-acute angle relative to the non-display area.

3. The display device of claim 1, further comprising at least one of a pixel defining layer and a black layer, wherein a distance between two spaced and immediately neighboring portions of the pixel defining layer or of the black layer is greater than a width of the non-display area, and wherein the width of the non-display area extends in the direction parallel to the first face of the first substrate from an edge of the first substrate to an edge of the second substrate.

4. The display device of claim 1, wherein the first part of the second auxiliary substrate overlaps the first face of the first substrate, and wherein the second part of the second auxiliary substrate overlaps a second face of the first substrate and is not oriented parallel to the first face of the first substrate.

5. The display device of claim 1, further comprising a driver positioned on the second section of the first auxiliary substrate and configured to supply a signal for controlling the pixels.

6. The display device of claim 1, wherein the pixels include a first pixel, and wherein the first pixel includes:
a first electrode positioned on the first section of the first auxiliary substrate;
a second electrode positioned between the first electrode and the first part of the second auxiliary substrate; and
a liquid crystal layer disposed between the first electrode and the second electrode.

7. The display device of claim 6, further comprising a sealant surrounding the liquid crystal layer and overlapping the non-display area, wherein a face of the sealant overlaps a second face of the first substrate and is not parallel to the first face of the first substrate.

8. The display device of claim 1, wherein the pixels include a first pixel, and wherein the first pixel includes:
a first electrode positioned on the first section of the first auxiliary substrate;
a second electrode positioned between the first electrode and the first part of the second auxiliary substrate; and
an organic light-emitting layer disposed between the first electrode and the second electrode.

9. The display device of claim 1, further comprising an outer black matrix overlapping the non-display area.

10. The display device of claim 9, wherein the outer black matrix includes a first black portion and a second black portion, wherein the first black portion is oriented parallel to the first face of the first substrate, and wherein the second black portion overlaps a second face of the first substrate and is oriented not parallel to the first face of the first substrate.

11. The display device of claim 1, wherein the first section of the first auxiliary substrate is thinner than the first part of the second auxiliary substrate in a direction perpendicular to the face of the first substrate.

12. A tiled display apparatus comprising an array of display panels, wherein each of the display panels includes:
a first substrate;
a second substrate including a display area and a non-display area, wherein the display area overlaps a first face of the first substrate, and wherein the non-display area extends beyond the first substrate in a direction parallel to the first face of the first substrate;
a first auxiliary substrate including a first section and a second section, wherein the first section overlaps the display area and is positioned between the first substrate and the display area, and wherein the second section overlaps the non-display area and is oriented at a first right-or-acute angle relative to the first section;
a second auxiliary substrate including a first part and a second part, wherein the first part overlaps the display area and is positioned between the first section and the display area, and wherein the second part overlaps the non-display area and is oriented at a second right-or-acute angle relative to the first part; and
a display element layer positioned between the first section and the first part and including pixels for displaying an image, wherein the pixels overlap the display area.

13. The tiled display apparatus of claim 12, wherein the display panels include a first display panel, wherein the first display panel comprises at least one of a pixel defining layer and a black layer, wherein a distance between two spaced and immediately neighboring portions of the pixel defining layer or of the black layer is greater than a width of the non-display area of the first display panel, and wherein the width of the non-display area of the first display panel extends in the direction parallel to the first face of the first substrate of the first display panel from an edge of the first substrate of the first display panel to an edge of the second substrate of the first display panel.

14. The tiled display apparatus of claim 12, wherein the display panels include a first display panel and a second display panel, wherein the second section of the first auxiliary substrate of the first display panel includes an end of the first auxiliary substrate of the first display panel, wherein the second section of the first auxiliary substrate of the second display panel includes an end of the first auxiliary substrate of the second display panel, and wherein the second section of the first auxiliary substrate of the first display panel is longer than the second section of the first auxiliary substrate of the second display panel in a direction perpendicular to the first face of the first substrate of the first display panel.

15. The tiled display apparatus of claim 13, further comprising a driver positioned directly on the second section of the first auxiliary substrate of the first display panel and configured to supply a signal for controlling at least the pixels of the first display panel, wherein no driver is positioned directly on the second section of the first auxiliary substrate of the second display panel, and wherein no intervening display panel is positioned between the first display panel and the second display panel.

16. The tiled display apparatus of claim 12, further comprising a first driver and a second driver, wherein the display panels include a first display panel and a second display panel, wherein no intervening display panel is positioned between the first display panel and the second display panel, wherein the first driver is positioned directly on the second section of the first auxiliary substrate of the first display panel and configured to provide a first signal set for controlling the pixels of the first display panel, wherein the second driver is positioned directly on the second section of the first auxiliary substrate of the second display panel and configured to provide a second signal set for controlling the pixels of the second display panel, and wherein at least one of the first driver and the second driver is positioned between the second section of the first auxiliary substrate of the first display panel and the second section of the first auxiliary substrate of the second display panel.

17. The tiled display apparatus of claim 12, wherein the first section of the first auxiliary substrate is thinner than the first part of the second auxiliary substrate in a direction perpendicular to the first face of the first substrate.

* * * * *